(12) United States Patent
Maruyama

(10) Patent No.: US 8,508,010 B2
(45) Date of Patent: Aug. 13, 2013

(54) SOLID-STATE IMAGING DEVICE, METHOD OF MANUFACTURING THE SAME, AND CAMERA AND ELECTRONIC APPARATUS USING THE SAME

(75) Inventor: Shunsuke Maruyama, Kanagawa (JP)

(73) Assignee: Sony Corporation (JP)

( * ) Notice: Subject to any disclaimer, the term of this patent is extended or adjusted under 35 U.S.C. 154(b) by 951 days.

(21) Appl. No.: 12/336,140

(22) Filed: Dec. 16, 2008

(65) Prior Publication Data
US 2009/0166783 A1     Jul. 2, 2009

(30) Foreign Application Priority Data

Dec. 28, 2007  (JP) ................................. 2007-340331

(51) Int. Cl.
*H01L 27/146* (2006.01)
(52) U.S. Cl.
USPC ............. 257/435; 257/E31.121; 257/E31.122
(58) Field of Classification Search
USPC ................... 257/432, 435, E31.121, E31.122
See application file for complete search history.

(56) References Cited

U.S. PATENT DOCUMENTS
6,690,045 B2 *   2/2004   Shinkawata .................. 257/258

FOREIGN PATENT DOCUMENTS

| JP | 07-045805    | 2/1995  |
|----|--------------|---------|
| JP | 2001-196571  | 7/2001  |
| JP | 2003-298034  | 10/2003 |
| JP | 2004-356585  | 12/2004 |
| JP | 2005-311015  | 11/2005 |
| JP | 2006-261247  | 9/2006  |
| JP | 2007-141873  | 6/2007  |
| JP | 2007-165403  | 6/2007  |

OTHER PUBLICATIONS

Japanese Patent Office Action corresponding to Japanese Serial No. 2007-340331 dated Nov. 24, 2009.

* cited by examiner

*Primary Examiner* — Julio J Maldonado
*Assistant Examiner* — Amar Movva
(74) *Attorney, Agent, or Firm* — Sheridan Ross P.C.

(57) ABSTRACT

A method of manufacturing a solid-state imaging device is provided. The method includes: forming an insulating layer extending over an effective pixel region where a plurality of pixels each having a photoelectric conversion element is arranged and a peripheral area adjacent to the effective pixel region; forming an opening in the insulating layer located immediately above the photoelectric conversion element on the effective pixel region; forming a dummy opening in the insulating layer on the peripheral region; and forming a buried layer on the insulating layer to fill the opening and the dummy opening formed in the insulating layer.

11 Claims, 12 Drawing Sheets

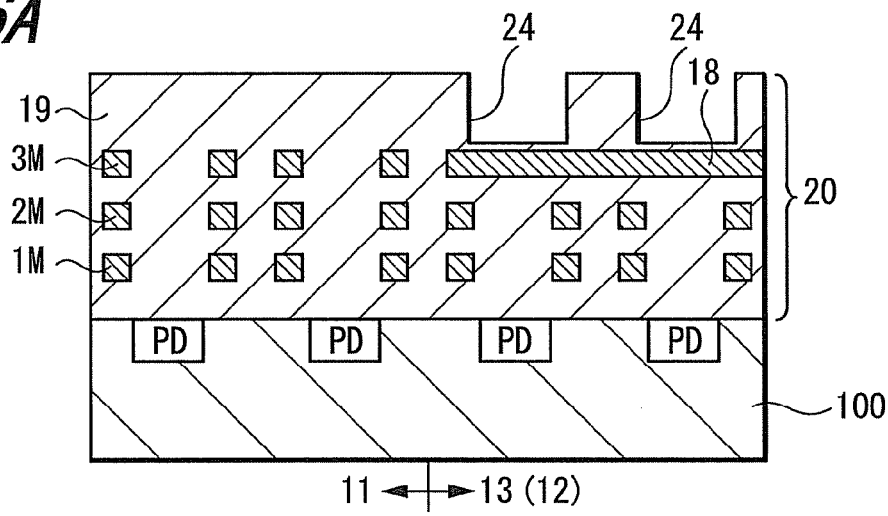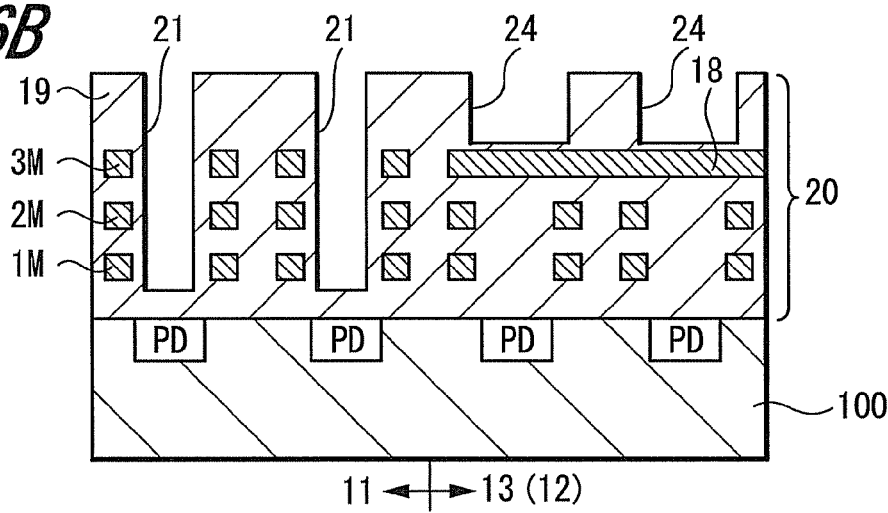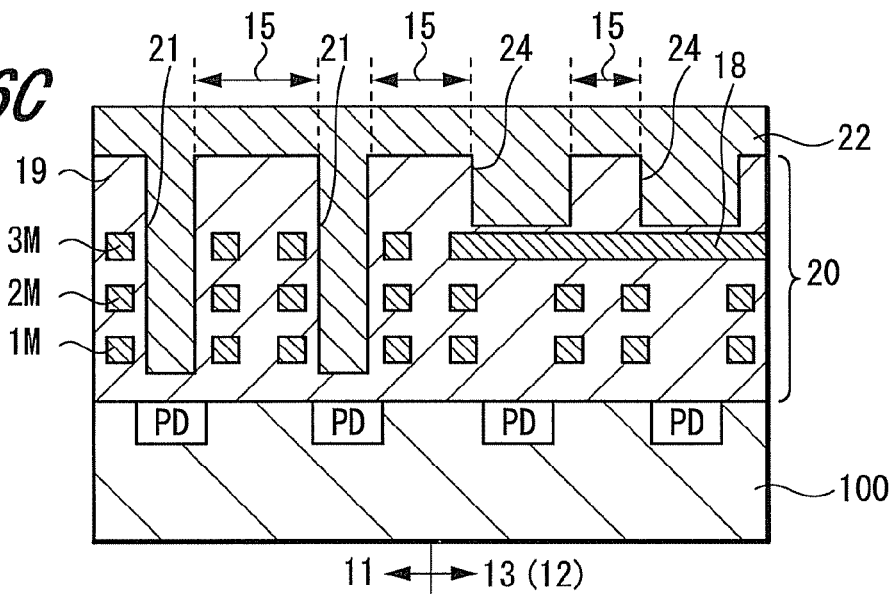

C—C

SOLID-STATE IMAGING DEVICE, METHOD OF MANUFACTURING THE SAME, AND CAMERA AND ELECTRONIC APPARATUS USING THE SAME

CROSS REFERENCES TO RELATED APPLICATIONS

The present invention contains subject matter related to Japanese Patent Application JP 2007-340331 filed in the Japanese Patent Office on Dec. 28, 2007, the entire contents of which being incorporated herein by reference.

BACKGROUND OF THE INVENTION

1. Field of the Invention

The present invention relates to a solid-state imaging device with a reduction in difference in level on film thickness on the boundary between an effective pixel region and a peripheral area; a method of manufacturing such a solid-state imaging device; a camera including such a solid-state imaging device; and an electronic apparatus having such a camera.

2. Description of the Related Art

Heretofore, various ideas have been proposed to improve the optical characteristics of a solid-state imaging device such as a CMOS image sensor or a CCD image sensor. For improving the sensitivity of a solid-state imaging device, for example, the device is designed to increase the amount of light incident on a photoelectric conversion element, or a photodiode.

Japanese Unexamined Patent Application Publication No. 2003-298034 and Japanese Unexamined Patent Application Publication No. H7-45805 disclose a solid-state imaging device with an optical waveguide on the light-entering side above a photodiode to improve the sensitivity of the device as a result of a increase in amount of light incident on the photodiode. The optical waveguide is formed by forming an opening on the light-entering side above the photodiode and covering and filling the opening with a material having a high refractive index.

Japanese Unexamined Patent Application Publication No. 2005-311015 describes the configuration of a CMOS solid-state imaging device having a plurality of wiring layers. In the case where a Cu wiring line and a Cu diffusion-preventing film are formed in the plurality of wiring layers, amount of light incident on a photodiode may be reduced since the Cu diffusion-preventing film reflects light to be incident on the photodiode. In Japanese Unexamined Patent Application Publication No. 2005-311015 described above, the Cu diffusion-preventing film formed above the photodiode is removed, thereby preventing a decrease in amount of light incident on the photodiode. For the removal of the Cu diffusion-preventing film formed above the photodiode, the patent document describes the step of removing the Cu diffusion-preventing film by forming an opening in the plurality of wiring layers above the photodiode. Furthermore, an optical waveguide is formed in the opening in the plurality of wiring layers.

For carrying out the step of removing a Cu diffusion-preventing film on the light-entering side above a photodiode as described in Japanese Unexamined Patent Application Publication No. 2005-311015 or the step of forming an optical waveguide on the light-entering side above a photodiode as described in Japanese Unexamined Patent Application Publication No. 2003-298034 and Japanese Unexamined Patent Application Publication No. H7-45805, additional steps of forming an opening above the photodiode and filling the opening with a material may be required.

A solid-state imaging device includes an effective pixel region, an optical black region, a peripheral circuit region, and the like. FIG. 1 illustrates a schematic configuration of a solid-state imaging device. For example, a solid-state imaging device 301, a CMOS image sensor as represented in FIG. 1, includes an imaging area 313 having an effective pixel region 311 and an optical black region 312. Furthermore, a vertical driving circuit 304, a horizontal driving circuit 306, and the like are formed in a peripheral circuit part. The imaging area 313 includes a plurality of pixels each having a photoelectric conversion element (a photodiode) and a pixel transistor (MOS transistor) in a two-dimensional matrix. The optical black region 312 is formed in part of the periphery of the effective pixel region 311 and includes a shading film to prevent light from being incident on a pixel. A signal provided as a reference signal for a black level is obtained in the optical black region 312. In the solid-state imaging device 301, light incident on the effective pixel region 311 is converted into signal electric charges and then output as a pixel signal through the peripheral circuit part.

As described above, light is incident on the photodiode in the pixels of the effective pixel region 311. In contrast, light may not be incident thereon in the pixels of the optical black region 312 on the periphery of the effective pixel region 311. Therefore, such structure as described in the above three patent documents for increasing an amount of light incident on the photodiode may be provided only in the effective pixel region 311. Specifically, an opening formed above the photodiode so as to remove a light diffusion-preventing film on the light-entering side above the photodiode, or an opening formed above the photodiode so as to make an optical waveguide on the light-entering side above the photodiode may only be required for the effective pixel region.

FIGS. 2A and 2B are cross-sectional views illustrating the process for manufacturing the solid-state imaging device 301, the CMOS image sensor, as described above. In the figure, a boundary between the effective pixel region 311 and the optical black region 312 is represented. Specifically, for example, FIGS. 2A and 2B are cross-sectional views along the line D-D shown in FIG. 1, illustrating the steps of forming openings above photodiodes PD in pixels on the effective pixel region 311.

FIGS. 2A and 2B illustrate only the photodiodes PD and a plurality of wiring layers 320 for simplified explanation. In actual, the plurality of wiring layers 320 are formed on a semiconductor substrate on which pixels each including such layers as a photodiode PD and a plurality of pixel transistors. Light is incident on the semiconductor substrate from the side where the plurality of wiring layers 320 are formed. As shown in FIGS. 2A and 2B, the plurality of wiring layers 320 include three layers of wiring lines 1M, 2M, and 3M. In addition, the wiring line 3M is provided as a shading film in the optical black region 312. Since the wiring line 3M is provided as a shading film on the optical black region 312, light may not be incident on the photodiode PD formed on the optical black region 312.

As shown in FIG. 2A, in order to increase an amount of light incident on the photodiode PD on the effective pixel region as described in the above-described three patent documents, openings 321 are formed first in an insulating interlayer 319 above the photodiodes PD on the effective pixel region 311. As shown in FIG. 2B, for example, an embedding material with a refractive index higher than that of the insulating interlayer 319 is applied to and fills the opening 321. An optical waveguide is formed in the opening 321 filled with the embedding material with a high refractive index.

As shown in FIG. 2B, in the step of forming a buried layer 322 by applying the embedding material to the opening 321, the embedding material can be simultaneously applied to the plurality of wiring layers 320 on the optical black region 312. Therefore, as shown in FIG. 2B, since no opening 321 is formed on the optical black region 312, the buried layer 322 formed on the plurality of wiring layers 320 on the optical black region 312 may be thicker than that formed in the openings 321 and on the plurality of wiring layers 320 on the effective pixel region 311. Since the buried layer 322 is unevenly applied in this manner, as shown in FIG. 2B, a difference in level on the surface of the buried layer 322 can be caused on the boundary between the effective pixel region 311 and the optical black region 312.

Likewise, FIGS. 3A to 3C illustrate an example in which openings 321 formed in the plurality of wiring layers 320 on the effective pixel region 311 are covered and filled with a buried layer 323 by the chemical vapor deposition (CVD) method or the physical vapor deposition (PVD) method. As shown in FIGS. 3A to 3C, the same structural elements as those in FIGS. 2A and 2B are designated by the same reference numerals and thus detailed description thereof will be hereinafter omitted.

As shown in FIG. 3A, if the openings 321 are filled with the buried layer 323 by the CVD method or the PVD method, the film thickness of the buried layer 323 formed as shown in FIG. 3B is almost constant. For this reason, there is a difference in density between the buried layer 323 formed on the area of openings 321 and that on the non-opening area. A difference in level on the boundary between the non-opening area and the area of openings 321 is caused. In other words, the embedding material is roughly applied to form a film on the effective region 311 on which openings 321 are formed. In contrast, the embedding material is densely applied to form a film on the optical black region 312 where any opening 321 is not formed.

Next, as shown in FIG. 3C, for planarizing the unevenness (so-called irregularity) of the buried layer 323 formed by the CVD method or the PVD method, the chemical mechanical polishing (CMP) method is employed to planarize the surface of the film made of the embedding material. However, it is difficult to planarize the surface by the CMP method. That is, the surface of the effective pixel region 311, on which the embedding material is roughly formed, and the surface of the optical black region 312, on which the embedding material is densely formed, may not be evenly planarized. As shown in FIG. 3C, a portion roughly made of the embedding material can be ground more quickly than a portion densely made thereof. Therefore, the buried layer 323 above the effective pixel region 311 is formed thinner than that formed above the optical black region 312.

In addition, in the example using a coating material as a buried layer 322 as shown in FIGS. 2A and 2B, the volume of the buried layer 322 decreases as a result of heat treatment in the step of baking after the formation of the buried layer 322. At this time, the volume of the buried layer 322 formed on the openings 321 is higher than that formed on the non-opening area by the volume of the openings. Thus, a more decrease in volume of the buried layer 322 at the time of baking can be observed on the openings 321. Accordingly, a decrease in volume after the step of baking leads to a larger difference in level between the effective pixel region 311 where openings 321 are formed densely and the optical black region 312 where any opening 321 is not formed.

Therefore, if there is a difference in level on the surface of the buried layer or a difference in film thickness thereof on the boundaries between the effective pixel region, the optical black region, and the peripheral circuit region of the solid-state imaging device, such a difference may affect any layer on or above the buried layer. Specifically, the uneven surface of the buried layer may affect the layers on or above the buried layer, such as a passivation film, a color filter, and an on-chip microlens. In addition, the difference in level or unevenness affecting the upper layer may have an influence on the inside of the effective pixel region. As a result, the optical characteristics of the pixels in the center and in periphery portions of the effective pixel region may vary, causing uneven sensitivity in an image output from the solid-state imaging device.

Japanese Unexamined Patent Application Publication No. 2001-196571 discloses a method of reducing a difference in level or film thickness between the effective pixel region and the peripheral area including the optical black region, the peripheral circuit part, and the like. The patent document describes a method of reducing a difference in level between the effective pixel region and the peripheral area by forming a concave insulating interlayer corresponding to the metal wiring line on the peripheral area. Further, Japanese Unexamined Patent Application Publication No. 2004-356585 discloses a method of applying an additional material, which can be subjected to patterning, to a portion lower in level even if there is a difference in level between the effective pixel region and the peripheral area, thereby reducing the difference in level. Furthermore, Japanese Unexamined Patent Application Publication No. 2007-165403 discloses a method of selectively etching a portion higher in level to remove the unevenness, thereby reducing the difference in level.

However, with any of the methods described in the above patent documents, for example, a decrease in difference in level between the effective pixel region and the peripheral area leads to an increase in number of steps.

SUMMARY OF THE INVENTION

In view of the above, it is desirable to provide a solid-state imaging device with a reduced unevenness of sensitivity by lowering a difference in level on the boundary between the effective pixel region and the peripheral area and a method of manufacturing such a device. It is also desirable to provide a camera including such a solid-state imaging device and an electronic apparatus having such a camera.

According to an embodiment of the present invention, there is provided a solid-state imaging device including: an effective pixel region where a plurality of pixels each having a photoelectric conversion element is arranged; and a peripheral area adjacent to the effective pixel region. The solid-state imaging device has an opening formed in an insulating layer immediately above a photoelectric conversion element on the effective pixel region; a dummy opening formed in an insulating layer above the peripheral area; and a buried layer filling the opening and the dummy opening.

The peripheral area of the solid-state imaging device according to an embodiment of the present invention may be an area including a peripheral circuit part, an optical black region, and the like, where light is not incident thereon.

The solid-state imaging device according to an embodiment of the present invention has the opening formed in the insulating layer on the effective pixel region and the dummy opening formed in the insulating layer on the peripheral area. Thus, a difference in level of the buried layer on the boundary between the effective pixel region and the peripheral area can be reduced.

According to another embodiment of the present invention, there is provided a method of manufacturing a solid-state imaging device. The method includes:
forming an insulating layer extending over an effective pixel region where a plurality of pixels each having a photoelectric conversion element is arranged and a peripheral area to the effective pixel region;
forming an opening in the insulating layer located immediately above the photoelectric conversion element on the effective pixel region;
forming a dummy opening in the insulating layer on the peripheral region; and
forming a buried layer on the insulating layer to fill the opening and the dummy opening formed in the insulating layer.

The method of manufacturing a solid-state imaging device according to an embodiment of the present invention forms the opening immediately above the photoelectric conversion element on the effective pixel region, while the dummy opening is formed on the insulating layer on the peripheral area. Therefore, a difference in density of openings formed on the effective pixel region and the peripheral area can be reduced. In addition, the buried layer formed on the insulating layer can be planarized.

According to further embodiment of the present invention, there is provided a camera including a solid-state imaging device, an optical system for introducing incident light into a photoelectric conversion element of the solid-state imaging device, and a signal processing circuit for processing a signal output from the solid-state imaging device. The solid-state imaging device includes: an effective pixel region where a plurality of pixels each having a photoelectric conversion element is arranged; and a peripheral area adjacent to the effective pixel region. In addition, the solid-state imaging device has an opening formed in an insulating layer immediately above a photoelectric conversion element on the effective pixel region; a dummy opening formed in an insulating layer above the peripheral area; and a buried layer filling the opening and the dummy opening.

According to further another embodiment of the present invention, there is provided an electronic apparatus that includes a camera having a solid-state imaging device, an optical system for introducing incident light into a photoelectric conversion element of the solid-state imaging device, and a signal processing circuit for processing a signal output from the solid-state imaging device. The solid-state imaging device includes: an effective pixel region where a plurality of pixels each having a photoelectric conversion element is arranged; and a peripheral area adjacent to the effective pixel region. In addition, the solid-state imaging device has an opening formed in an insulating layer immediately above a photoelectric conversion element on the effective pixel region; a dummy opening formed in an insulating layer above the peripheral area; and a buried layer filling the opening and the dummy opening.

The camera or the electronic apparatus having such a camera according to an embodiment of the present invention uses the solid-state imaging device with a reduced difference in level on the boundary between the effective pixel region and the peripheral area.

According to any of the above embodiments of the present invention, an unevenness of the film thickness on the boundary between the effective pixel region and the peripheral area of the solid-state imaging device can be reduced, causing a decrease in unevenness of sensitivity.

BRIEF DESCRIPTION OF THE DRAWINGS

FIG. 2A and FIG. 2B illustrate steps of the method.

FIG. 3A, FIG. 3B, and FIG. 3B illustrate steps of the method.

FIG. 5A, FIG. 5B, and FIG. 5C represent steps of the method.

FIGS. 6A to 6C are schematic cross-sectional views illustrating a second example of a method of manufacturing a solid-state imaging device according to an embodiment of the present invention, where FIG. 6A, FIG. 6B, and FIG. 6C represent steps of the method.

FIG. 7A, FIG. 7B, and FIG. 7C represent steps of the method.

FIG. 8A shows a top view and FIG. 8B shows a cross-sectional view along the line C-C in FIG. 8A.

FIG. 9A, FIG. 9B, and FIG. 9C represent steps of the method.

DESCRIPTION OF THE PREFERRED EMBODIMENTS

Hereinafter, embodiments of the present invention will be described with reference to FIGS. 4 to 14.

Figure 1:
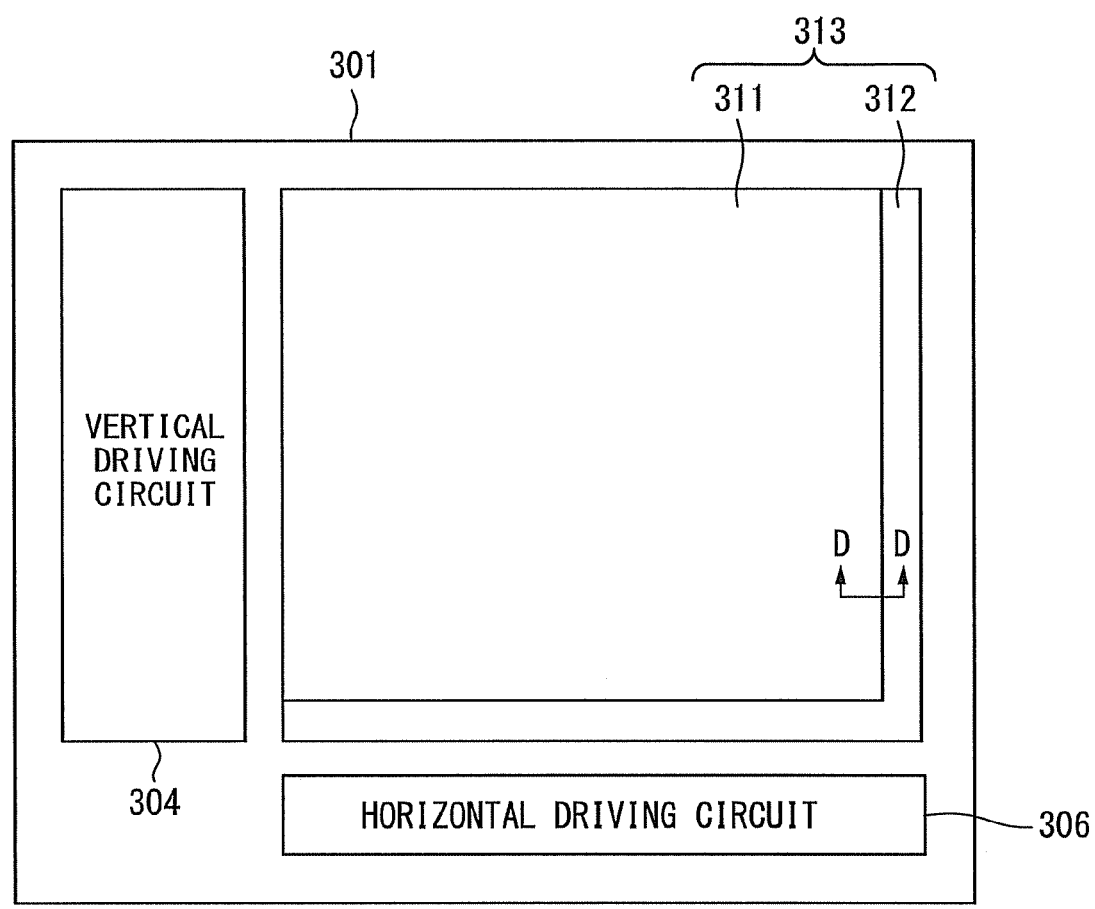
FIG. 1 is a schematic diagram illustrating a solid-state imaging device of the related art.
Figure 2A:
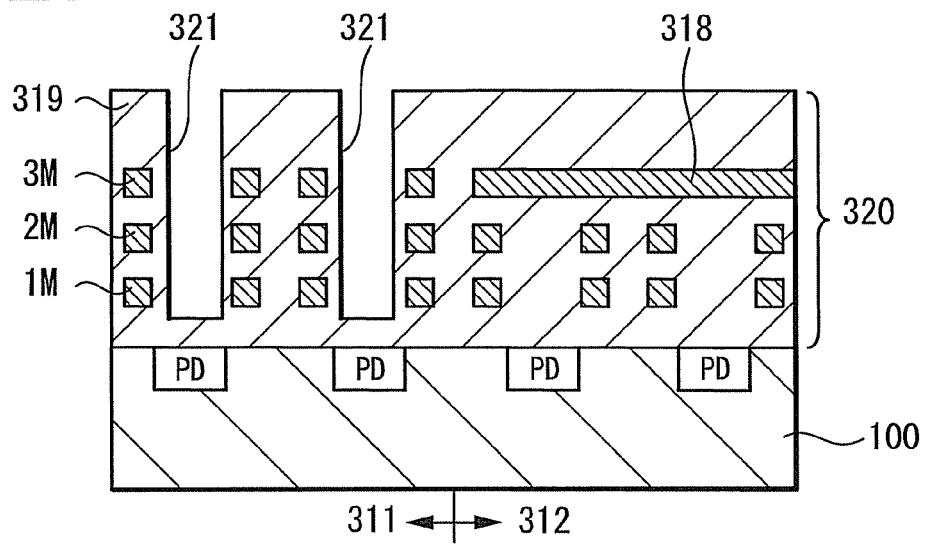
FIGS. 2A and 2B are schematic views illustrating a method of manufacturing a solid-state imaging device of the related art, where
Figure 2B:
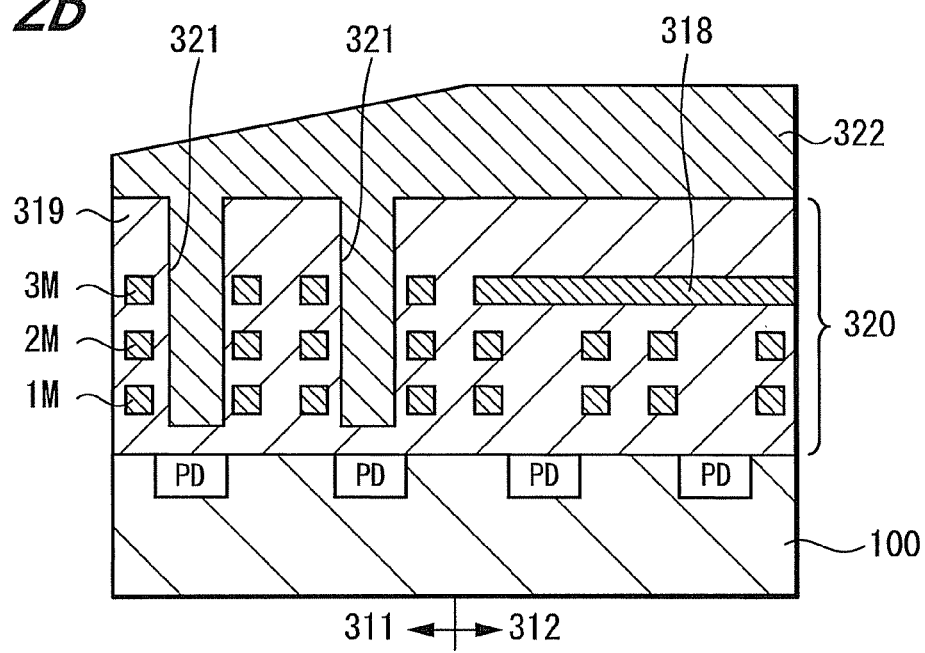
Figure 3A:
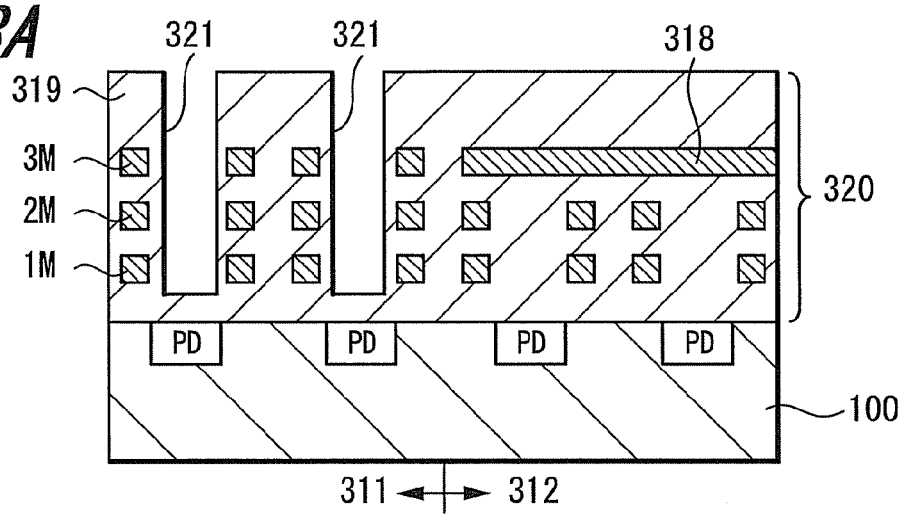
FIGS. 3A to 3C are schematic views illustrating a method of manufacturing a solid-state imaging device of the related art, where
Figure 3B:
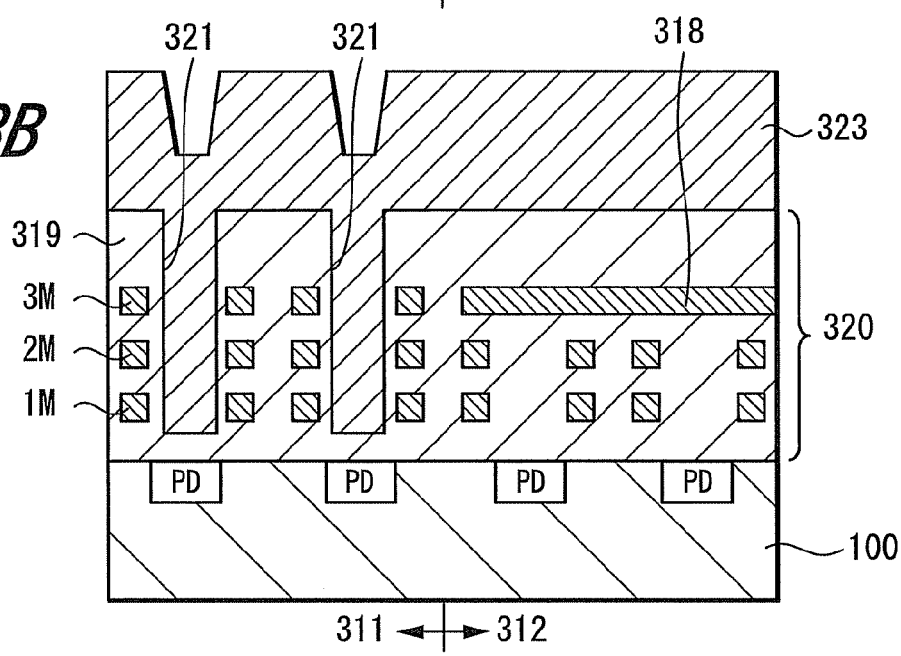
Figure 3C:
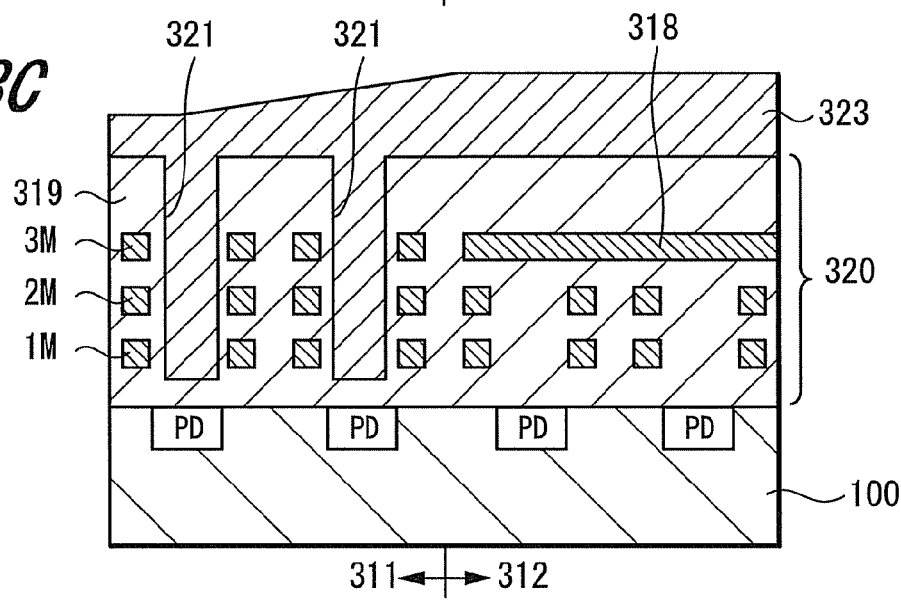
Figure 4:
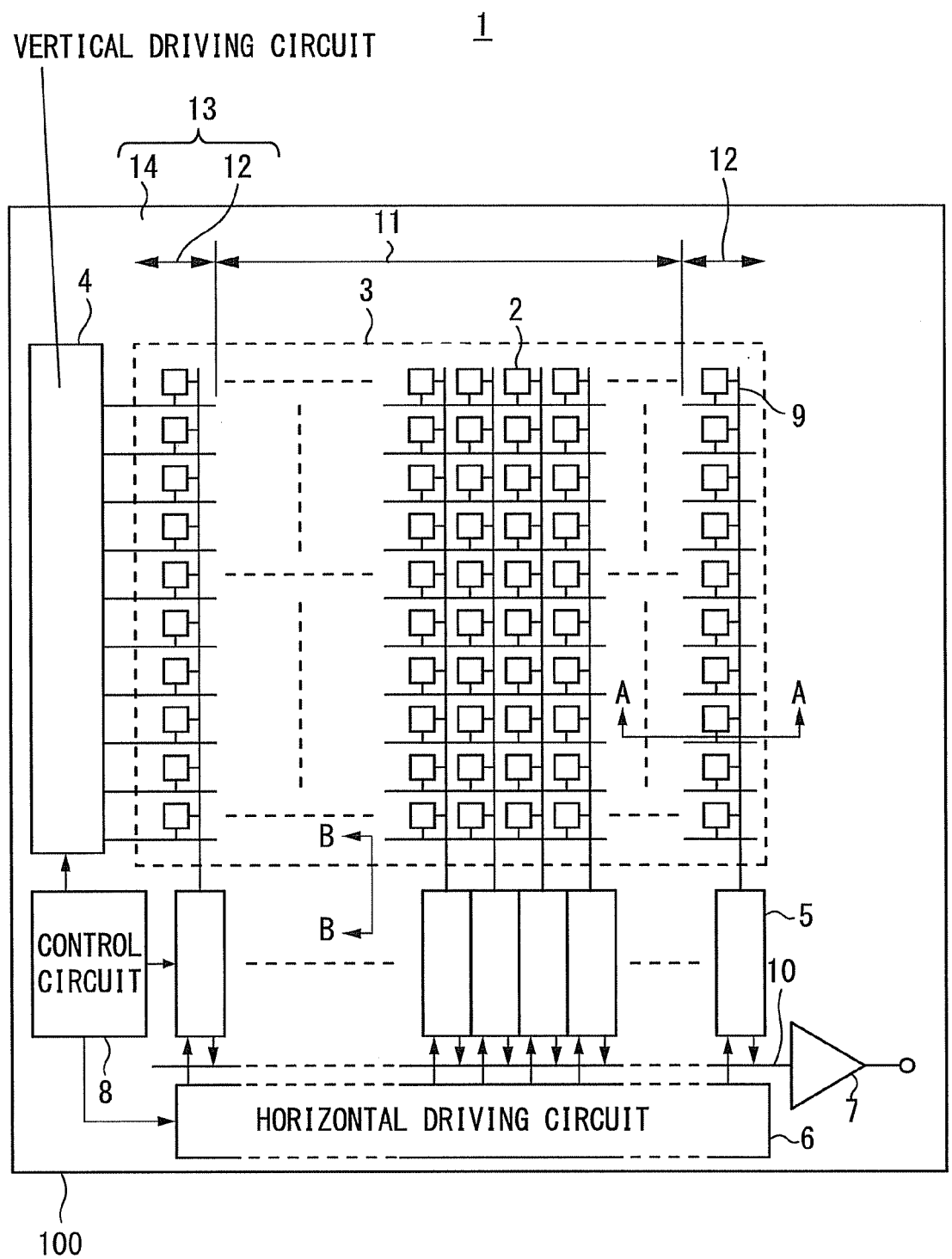
FIG. 4 is a schematic diagram illustrating a solid-state imaging device according to an embodiment of the present invention.

Referring first to FIG. 4, a solid-state imaging device in accordance with an embodiment of the present invention is schematically illustrated. In the figure, a CMOS image sensor is represented as an example of a solid-state imaging device 1 of the present embodiment. The CMOS image sensor includes an imaging area 3 and a peripheral circuit part 14 on a substrate 100 such as one made of Si. The imaging area 3 includes an effective pixel region 11 and an optical black region 12. The effective pixel region 11 includes a plurality of imaging pixels 2, each having a photoelectric conversion element, arranged in a two-dimensional matrix (i.e., in rows and columns). In this embodiment, the optical black region 12 and the peripheral circuit part 14 constitute a peripheral area 13.

As mentioned above, the imaging area 3 includes the effective pixel region 11 and the optical black region 12 formed on the periphery of the effective pixel region 11. Each of the imaging pixels 2 on the imaging area 3 includes a photodiode provided as the photoelectric conversion element and a plurality of pixel transistors (MOS transistors). The pixel transistors convert signal charges generated by photoelectric conversion at the photodiode into pixel signals output to a vertical signal line 9. On the effective pixel region 11, the photoelectric conversion element photoelectrically converts light incident on the photodiode into a signal electric charge. Subsequently, the pixel transistors convert the signal electric charge into a pixel signal. The pixel signal is supplied to the peripheral circuit part 14 through the vertical signal line 9. The optical black region 12 includes a shading film in addition to imaging pixels 2 similar to those on the effective pixel region 11. The shading film prevents light from being incident on the photodiodes on the optical black region 12. Thus, the optical black region 12 is configured to output a black reference signal. The plurality of pixel transistors may include four different transistors: a transfer transistor, a reset transistor, an amplification transistor, and a selection transistor, or may include three of them excluding the selection transistor.

Furthermore, the peripheral circuit part 14 includes a vertical driving circuit 4, a column signal processing circuit 5, a horizontal driving circuit 6, an output circuit 7, and a control circuit 8.

The control circuit 8 generates a clock signal, a control signal, and the like, which can be used for the operations of the vertical driving circuit 4, column signal processing circuit 5, horizontal driving circuit 6, and the like, on the basis of a vertical synchronization signal, a horizontal synchronization signal, and a master clock. The generated signals are input into the vertical driving circuit 4, the column signal processing circuit 5, the horizontal driving circuit 6, and the like.

The vertical driving circuit 4 includes, for example, a sift resistor. In other words, the vertical driving circuit 4 performs scanning in the vertical direction (column direction) to successively select imaging pixels 2 in row at a time on the imaging area 3. Then, a pixel signal obtained in response to the signal electric charge photoelectrically converted at the photodiode of each imaging pixel is supplied to the column signal processing circuit 5 through the vertical signal line 9. The photodiode generates signal electric charges in response to the amount of light received.

The column signal processing circuits 5 are arranged for the respective columns of imaging pixels 2. Signals from the pixels in row are processed for each pixel column in response to signals from the optical black region 12. In other words, the column signal processing circuit 5 carries out such signal processing as noise removal and signal amplification in the effective pixel region 11 in response to a black reference signal output from the optical black region 12.

A horizontal selection switch (not shown) is connected between the output side of the column signal processing circuit 5 and a horizontal signal line 10.

The horizontal driving circuit 6 includes a shift resistor or the like to successively output horizontal scanning pulses and select the respective column signal processing circuits 5 in order to allow the circuits 5 to output pixel signals to the horizontal signal line 10, respectively. The output circuit 7 carries out processing of signals successively supplied from the respective column signal processing circuits 5 through the vertical signal line 10.

Hereinafter, examples of a solid-state imaging device and a method of manufacturing the same according to an embodiment of the present invention will be described, respectively.

FIRST EXAMPLE

Figure 5A:
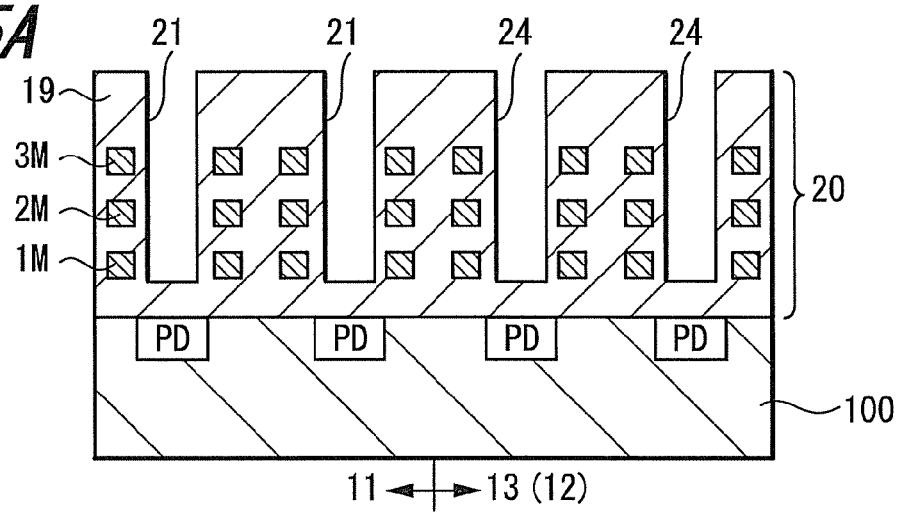
FIGS. 5A to 5C are schematic cross-sectional views illustrating a first example of a method of manufacturing a solid-state imaging device according to an embodiment of the present invention, where
Figure 5B:
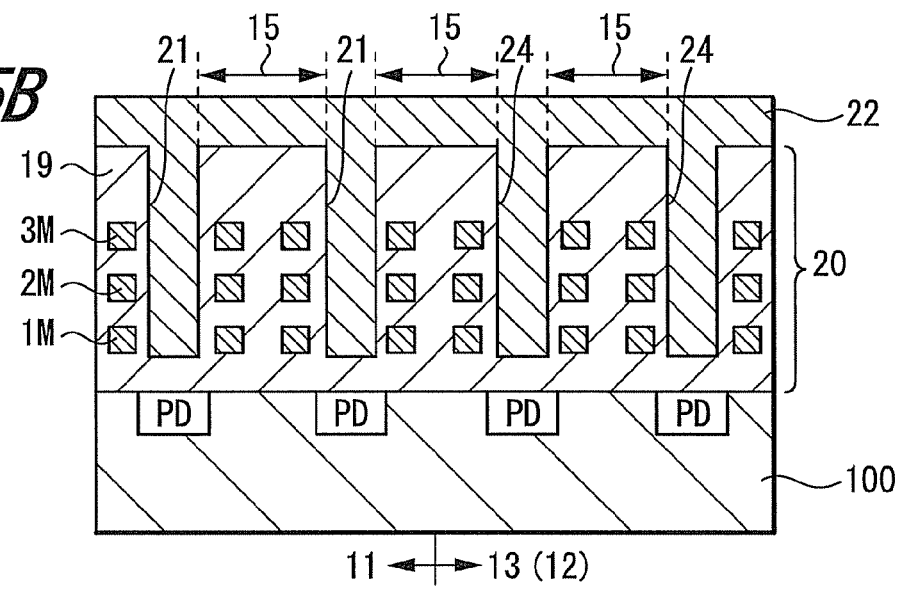
Figure 5C:
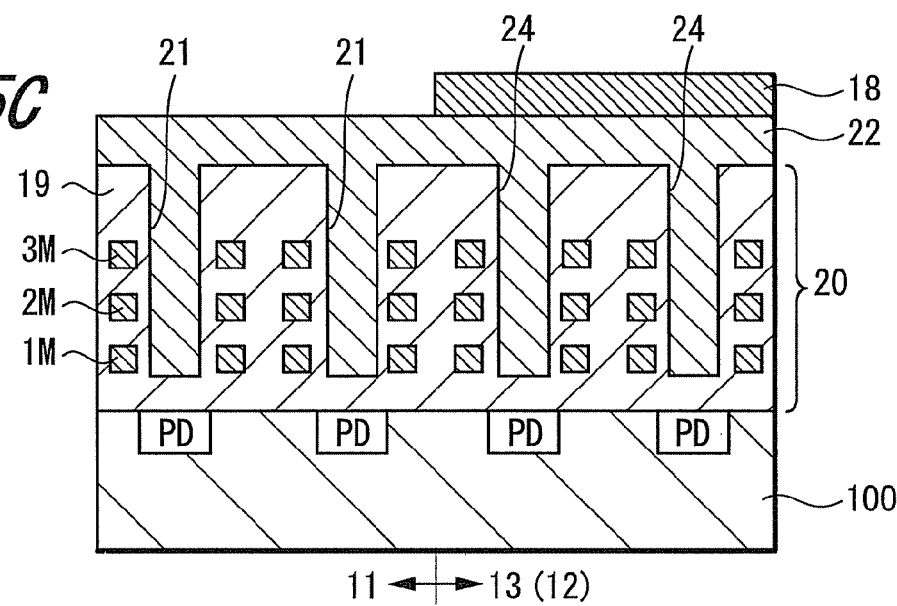

FIGS. 5A to 5C are schematic cross-sectional views illustrating a first example of a configuration of a solid-state imaging device and a method of manufacturing the same according to an embodiment of the present invention. Each of the schematic cross-sectional views of the solid-state imaging device is along the line A-A or B-B in FIG. 4, or the line extending across the effective pixel region 11 and the peripheral area 13 including the optical black region 12 and the peripheral circuit part 14. For simplified illustration, FIGS. 5A to 5C each represent only photodiodes PD (photoelectric conversion elements of the imaging pixel 2) and a plurality of wiring layers 20 thereon. In actual, the plurality of wiring layers 20 are formed above the Si substrate 100 where elements, such as pixel transistors of the imaging pixels 2 and CMOS transistors of the peripheral circuit part 14 are mounted.

The plurality of wiring layers 20 shown in FIGS. 5A to 5C includes three metal wiring lines 1M, 2M, and 3M each of which is embedded in an insulating interlayer 19.

According to this example, as shown in FIG. 5A, openings 21 are formed in the plurality of wiring layers 20 such that they are opened immediately above the corresponding photodiodes PD on the effective pixel region 11. Similarly, dummy openings 24 are also formed in the plurality of wiring layers 20 on the optical black region 12 in a manner similar to the openings 21 of the effective pixel region 11. In other words, in this embodiment, the openings 21 and the dummy openings 24 are formed almost at constant intervals on the effective pixel region 11 and the peripheral area 13, respectively.

Next, as shown in FIG. 5B, a buried layer 22 is formed, for example, by coating the openings 21 on the effective pixel region 11 and the dummy openings 24 on the peripheral area 13 with an embedding material. The buried layer 22 may be formed by the CVD or PVD method instead of coating. Simultaneously, in this case, the buried layer 22 is also formed on a non-opening region 15. In addition, the buried layer 22 formed on the opening 21 above the corresponding photodiode PD on the effective pixel region 11 may be made of an organic material with a refractive index higher than that of the insulating interlayer 19 in the plurality of wiring layers 20 so that the opening 21 will be an optical waveguide. The buried layer 22 may be made of siloxane resin or any of other resin materials with high refractive indexes, such as polyimide, acryl resin, and polysthyrene resin. In the case of using the siloxane resin, the refractive index of the resin may be adjusted to be appropriate with the addition of an additive. The siloxane resin containing the additive may have a refractive index of 1.7 or the like. For obtaining high refractive index, the additive added to the above resin may be fine particles of metal oxide, such as titanium oxide, tantalum oxide, niobium oxide, tungsten oxide, zirconium dioxide, zinc oxide, indium oxide, or hafnium oxide. Furthermore, for example, the insulating interlayer 19 may be made of $SiO_2$ with a refractive index of 1.4.

Thus, an optical waveguide is formed in the opening 21 by filling the opening 21 with the organic material having a high refractive index embedded. Therefore, incident light may be refracted by the optical waveguide, followed by efficiently entering the photodiode PD of the effective pixel region 11.

Subsequently, after forming the buried layer 22 that covers and fills the openings 21, dummy openings 24, and non-opening regions 15 respectively in the effective pixel regions 11 and the peripheral area 13 to be planarized, as shown in FIG. 5C, a shading film 18 is formed above the plurality of wiring layers 20 on the peripheral area 13. With the formation of the shading film 18, light is prevented from being incident on the photodiodes PD in the optical black region 12. Therefore, the optical black region 12 can output a signal representing the black level.

Subsequently, although not shown in the figure, a passivation film, a color filter, an on-chip microlens, and the like are formed in order on the resulting structure to obtain a desired solid-state imaging device.

According to the first example, difference in the density of openings in the plurality of wiring layers 20 between the peripheral area 13 and the effective pixel region 11 may be reduced by forming the dummy openings 24 in the peripheral area 13, which may not originally require any opening, at the same intervals as those of the openings 21 in the effective pixel region 11. Therefore, in a subsequent step of filling the openings with an embedding material, the openings can be evenly covered and filled with the material. Furthermore, in the step of post-baking after applying the embedding material, a decrease in volume of each of the effective pixel region 11 and the peripheral area 13 occurs in proportion to a decrease in volume of the buried layer 22. Therefore, the boundary between the effective pixel region 11 and the peripheral area 13 can be prevented from forming an uneven surface of the buried layer 22 on the plurality of wiring layers 20.

Since the buried layer 22 is evenly formed, there is no influence of a difference in level on any of the passivation film, color filter, on-chip microlens, and so on (not shown) to be formed above the buried layer 22 in subsequent steps. Thus, the effective pixel region 11 can be prevented from being affected by a difference in level on the surface and from causing uneven sensitivity.

Furthermore, even in the case of forming the buried layer 22 by the CVD method or the PVD method, a difference in level on the surface of the buried layer 22 over the openings 21 and the dummy openings 24 in the effective pixel region 11 and the peripheral area 13 can be reduced. Thus, the buried layer 22 can be uniformly planarized by the CMP processing or the like. Furthermore, during the CMP processing, both the plurality of wiring layers 20 and the buried layer 22 on the peripheral area 13 can be prevented from being out of alignment on their boundary since the dummy openings 24 are formed in the peripheral area 13 and covered and filled with the buried layer 22.

SECOND EXAMPLE

FIGS. 6A to 6C are schematic cross-sectional views illustrating a second example of a method of manufacturing a solid-state imaging device according to an embodiment of the present invention. The cross-sectional structure of the solid-state imaging device schematically illustrated in FIGS. 6A to 6C are viewed along the line A-A or B-B in FIG. 4 as in the case with the first example. In other words, it is along the line extending across an effective pixel region 11 and a peripheral area 13 including an optical black region 12 and a peripheral circuit part 14. In FIGS. 6A to 6C, the same structural elements as those in FIGS. 5A to 5C are designated by the same reference numerals and thus detailed description thereof will be hereinafter omitted.

In the present example, first, a plurality of wiring layers 20 include an uppermost metal wiring line 3M formed as a shading film 18 on a peripheral area 13 as shown in FIG. 6A. In the plurality of wiring layers 20, as shown in 6A, dummy openings 24 are formed in an insulating interlayer 19 in the plurality of wiring layers 20 on the peripheral area 13. For example, the bottoms of the respective dummy openings 24 may be formed immediately above the metal wiring line 3M to avoid them from reaching to the shading film 18.

Next, as shown in FIG. 6B, openings 21 are formed in the insulating interlayer 19 in the plurality of wiring layers 20 located above photodiodes PD on an effective pixel region 11 so that the bottoms of the respective openings 21 can be immediately above the corresponding photodiodes PD.

Here, in this example, dummy openings 24 are formed in the plurality of wiring layers 20 on the peripheral area 13, while the openings 21 are formed in the plurality of wiring layers 20 on the effective pixel region 11. These openings 24 and 21 are formed so that they can have substantially the same opening volume.

As described above, the shading film 18 is formed in the plurality of wiring layers 20 on the peripheral area 13. When it is difficult to form openings in both the peripheral area 13 and the effective pixel region 11 similarly, separate steps may be carried out (i.e., two opening operations) to form openings 21 and dummy openings 24.

Next, as shown in FIG. 6C, a buried layer 22 is formed, for example, by coating the openings 21 of the effective pixel region 11 and the dummy openings 24 of the peripheral area 13 with an embedding material. The buried layer 22 may be formed by the CVD method or the PVD method. Simultaneously, the buried layer 22 also extends over a non-opening region 15. In addition, the buried layer 22 formed on the opening 21 above the corresponding photodiode PD of the effective pixel region 11 may be made of an organic material with a refractive index higher than that of the insulating interlayer 19 in the plurality of wiring layers 20 so that the opening 21 will be an optical waveguide. Examples of such an organic material for the buried layer 22 include siloxane resin or any of other resin materials with high refractive indexes, such as polyimide, acryl resin, and polysthyrene resin. In the case of using the siloxane resin, the refractive index of the resin may be adjusted to be appropriate with the addition of an additive. The siloxane resin containing the additive may have a refractive index of 1.7 or the like. For obtaining higher refractive index, the additive added to the above resin may be fine particles of metal oxide, such as titanium oxide, tantalum oxide, niobium oxide, tungsten oxide, zirconium dioxide, zinc oxide, indium oxide, or hafnium oxide. Furthermore, for example, the insulating interlayer 19 may be made of $SiO_2$ with a refractive index of 1.4.

Thus, an optical waveguide is formed in the opening 21 by embedding the organic material with a high refractive index in the opening 21. Therefore, incident light can be refracted by the optical waveguide, followed by efficiently entering the photodiodes PD of the effective pixel region 11.

In this example, as described above, the plurality of wiring layers 20 include the uppermost metal wiring line 3M formed as a shading film 18. Since the shading film 18 is formed, light is prevented from being incident on the photodiodes PD in the optical black region 12. Therefore, the optical black region 12 can output a signal representing the black level.

According to the second example, the dummy openings 24 are formed in the peripheral area 13 where any opening may not be originally required. The dummy openings 24 have substantially the same volume as that of the openings 21 on the effective pix region 11. Thus, the volume of the buried layer 22 may be reduced equally on both the effective pixel region 11 and the peripheral area 13 even when the volume of the buried layer 22 on both the openings 21 and the dummy openings 24 is reduced during a step of baking. Therefore, even after the baking step, the boundary between the effective pixel region 11 and the peripheral area 13 can be prevented from forming an uneven surface of the buried layer 22.

Furthermore, even in the case of forming the buried layer 22 by the CVD method or the PVD method, a difference between the density of distribution of the openings 21 on the effective pixel region 11 and the density of distribution of the dummy openings 24 on the peripheral area 13 (i.e., a difference in density of the openings) can be reduced. Thus, for example, even in the process of planarization with CMP after forming the buried layer 22, the surface of the buried layer 22 can be uniformly planarized. Furthermore, as described above, the dummy openings 24 are formed on the peripheral area 13 and covered and filled with the buried layer 22. Thus, the boundary between the plurality of wiring layers 20 and the buried layer 22 on the peripheral area 13 can be provided with unevenness in cross section. As a result, during the CMP processing, resistance to transverse stress on the boundary between the plurality of wiring layers 20 and the buried layer 22 may be increased on the peripheral area 13, thereby preventing the layers 20 and 22 from being out of alignment on their boundary.

Furthermore, in the second example, the openings 21 and the dummy openings 24 may be formed separately in two different steps to make a difference between their opening depths. Therefore, the second example can be applied even in the case where the lower-layer metal wiring lines are densely formed on the peripheral area 13 and it is difficult to obtain a sufficient depth of each opening.

THIRD EXAMPLE

Figure 7A:
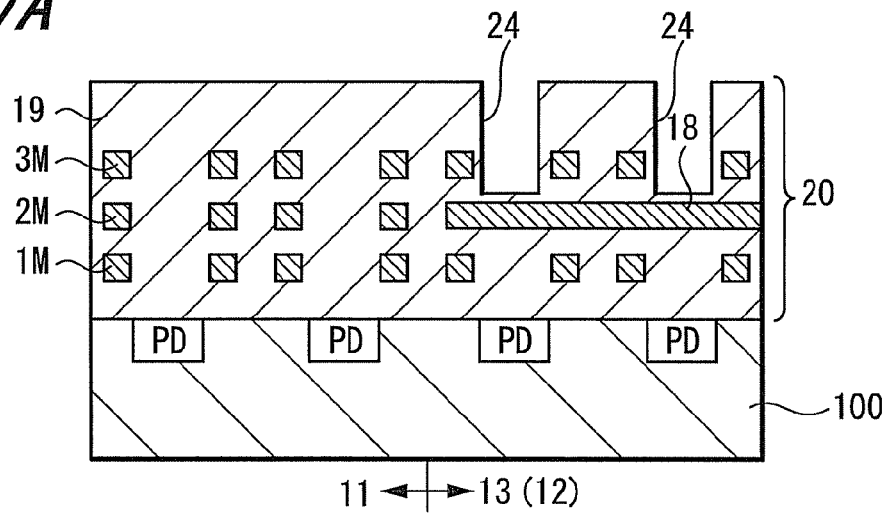
FIGS. 7A to 7C are schematic cross-sectional views illustrating a third example of a method of manufacturing a solid-state imaging device according to an embodiment of the present invention, where
Figure 7B:
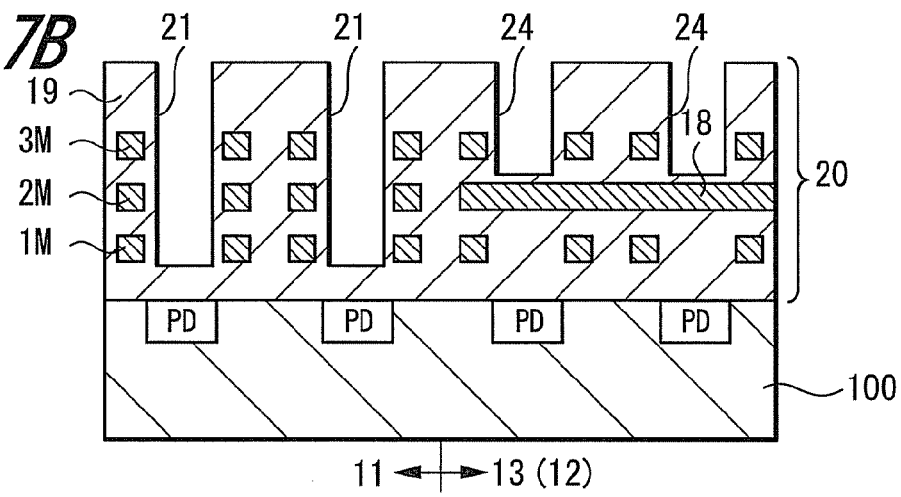
Figure 7C:
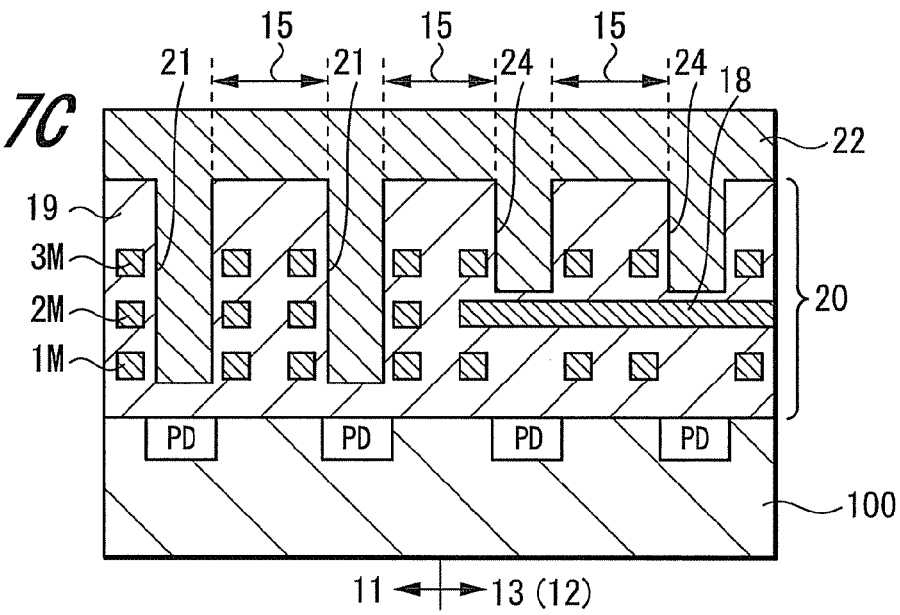

FIGS. 7A to 7C are schematic cross-sectional views illustrating a third example of a method of manufacturing a solid-state imaging device according to an embodiment of the present invention. The cross-sectional structure of the solid-state imaging device schematically illustrated in FIGS. 7A to 7C is viewed along the line A-A or B-B in FIG. 4 as in the case with the first and second examples. In other words, it is along the line extending across an effective pixel region 11 and a peripheral area 13 including an optical black region 12 and a peripheral circuit part 14. In FIGS. 7A to 7C, the same structural elements as those in FIGS. 5 and 6 are designated by the same reference numerals and thus detailed description thereof will be hereinafter omitted.

In this example, first, a plurality of wiring layers 20 include three metal wiring lines 1M, 2M, and 3M. Among them, the middle metal wiring line 2M is formed as a shading film 18 as shown in FIG. 7A. In the plurality of wiring layers 20, as shown in FIG. 7A, dummy openings 24 are formed in an insulating interlayer 19 in the plurality of wiring layers 20 on the peripheral area 13. For example, the bottoms of the respective dummy openings 24 may be formed immediately above the metal wiring line 2M to avoid them from reaching to the shading film 18.

Next, as shown in FIG. 7B, openings 21 are formed in the insulating interlayer 19 in the plurality of wiring layers 20 located above photodiodes PD on an effective pixel region 11 so that the bottoms of the respective openings 21 can be immediately above the corresponding photodiodes PD.

Here, in the third example, it is preferable that opening volume of dummy openings 24 formed in the insulating interlayer 19 in the plurality of wiring layers 20 on the peripheral area 13 is substantially the same as that of the openings 21 formed in the insulating interlayer 19 in the plurality of wiring layers 20 on the effective pixel region 11.

As described above, even if the shading film 18 formed in the peripheral area 13 is not the uppermost metal wiring line in the plurality of wiring layers 20, the dummy openings formed in the peripheral area 13 may be opened immediately above the shading film 18.

Subsequently, an embedding material is applied to the openings 21 formed in the plurality of wiring layers 20 on the effective pixel region 11 and the dummy openings 24 formed in the plurality of wiring layers 20 on the peripheral area 13. Here, it is preferable that the opening 21 is covered and filled with, for example, an organic material with a refractive index higher than that of the insulating interlayer 19 in the plurality of wiring 20, thereby forming an optical waveguide in each of the openings 21 above the corresponding photodiodes PD on the effective pixel region 11. Since the openings 21 are embedded with the organic material with a high reflective index, the optical waveguide in each opening 21 refracts the light incident on the effective pixel region 11 to allow the light to efficiently enter the photodiode PD on the effective pixel region 11.

In the third example, as described above, the metal wiring line 2M on the peripheral area 13 is provided as a shading film 18. Since the shading film 18 is formed, light is prevented from being incident on the photodiodes PD in the optical black region 12. Therefore, the optical black region 12 can output a signal representing the black level.

According to the third example, since the dummy openings 24 are formed in the peripheral area 13 where any opening may not be originally required, a difference in the density of distribution of openings in the plurality of wiring layers 20 can be reduced. Thus, an embedding material can be evenly applied to the plurality of wiring layers 20. Therefore, a difference in level on the boundary between the effective pixel region 11 and the peripheral area 13 can be reduced. In addition, the openings 21 formed in the plurality of wiring layers 20 on the effective pixel region 11 and the dummy openings 24 formed in the plurality of wiring layers 20 on the peripheral area 13 may be formed so that they can have substantially the same opening volume. In this case, even if the volume of the buried layer 22 is reduced at the time of baking, the reducing volume of the buried layer 22 of the effective pixel region 11 and the reducing volume of the buried layer 22 of the peripheral area 13 can be adjusted to be equal to each other. Therefore, even after the step of baking the buried layer 22, a difference in level on the surface of the buried layer 22 on the boundary between the effective pixel region 11 and the peripheral area 13 can be reduced.

Figure 8A:
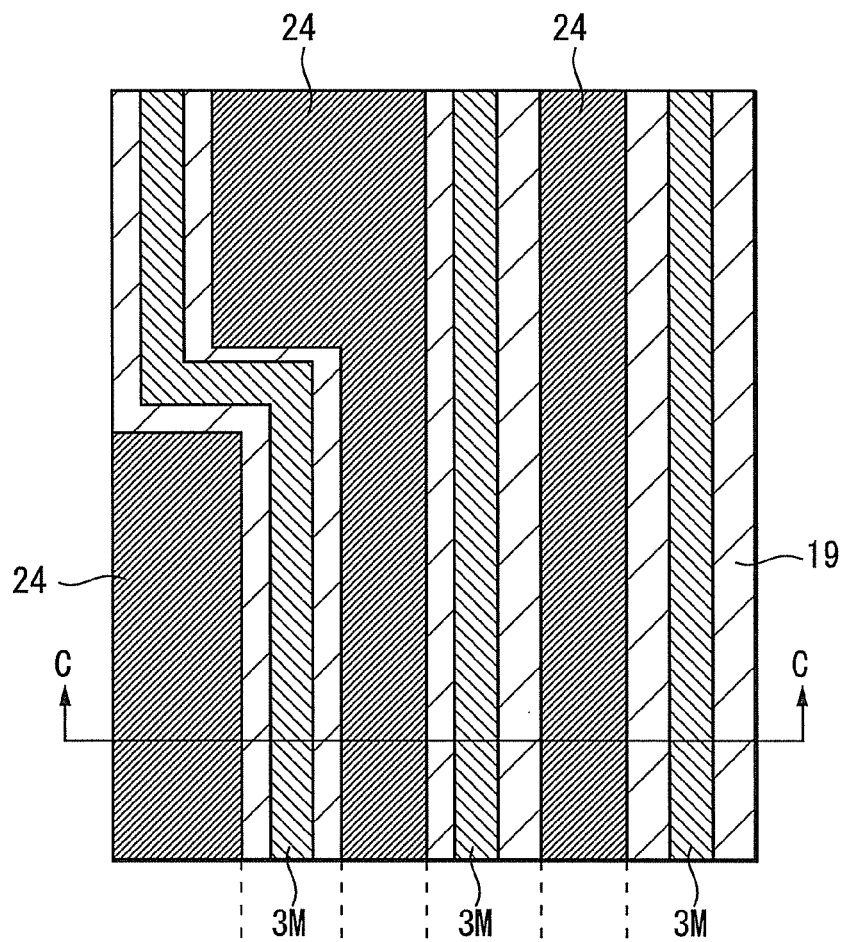
FIGS. 8A and 8B are schematic views illustrating a modified example of the third example of a method of manufacturing a solid-state imaging device according to an embodiment of the present invention, where
Figure 8B:
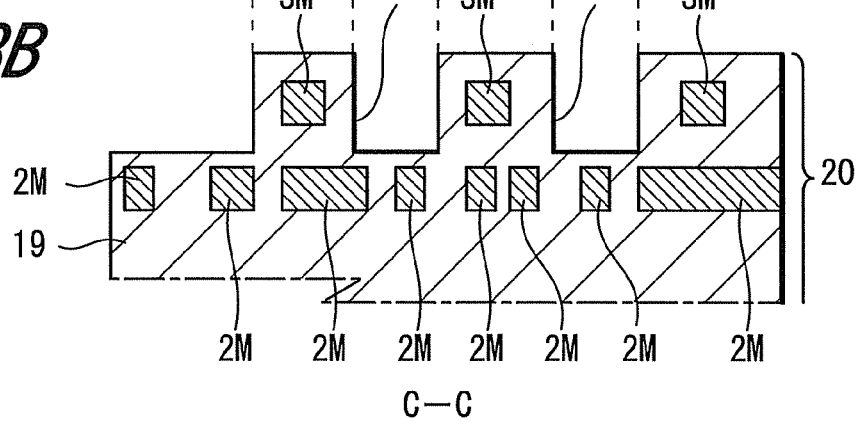

FIG. 8A illustrates a top view of the metal wiring line 3M in the plurality of wiring layers 20 on the peripheral circuit part 14, or part of the peripheral area 13. FIG. 8B is a cross-sectional view of the plurality of wiring layers 20 along the line C-C in FIG. 8A. If the uppermost metal wiring line 3M may not form the shading film 18 and the uppermost metal wiring line 3M is sparsely arranged, the dummy openings 24 formed on the peripheral area 13 may be arranged along the metal wiring lines 3M as shown in the figure.

In other words, the buried layer 22 can be evenly formed above the plurality of wiring layers 20 by optimizing a difference between the opening volume of the dummy openings 24 on the peripheral area 13 and the opening volume of the openings 21 on the effective pixel region 11 and the density of distribution of the openings 24 and 21.

FOURTH EXAMPLE

Figure 9A:
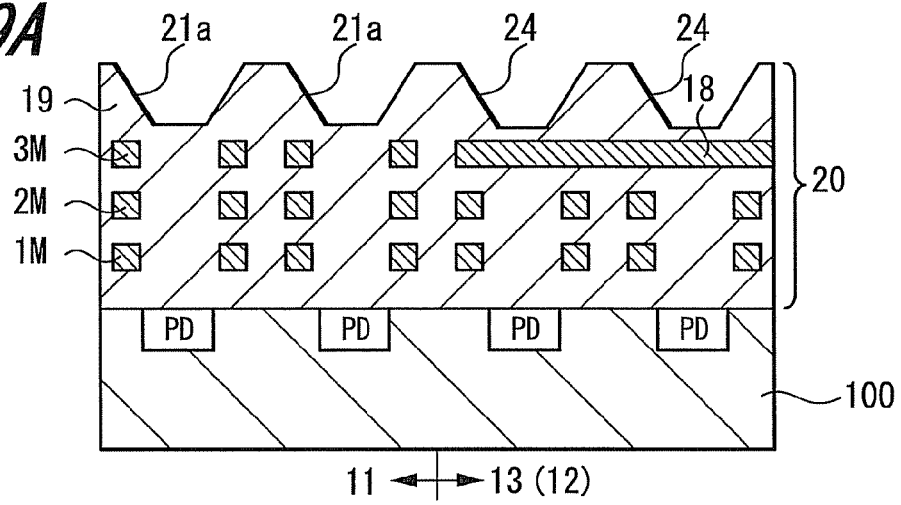
FIGS. 9A to 9C are schematic cross-sectional views illustrating a fourth example of a method of manufacturing a solid-state imaging device according to an embodiment of the present invention, where
Figure 9B:
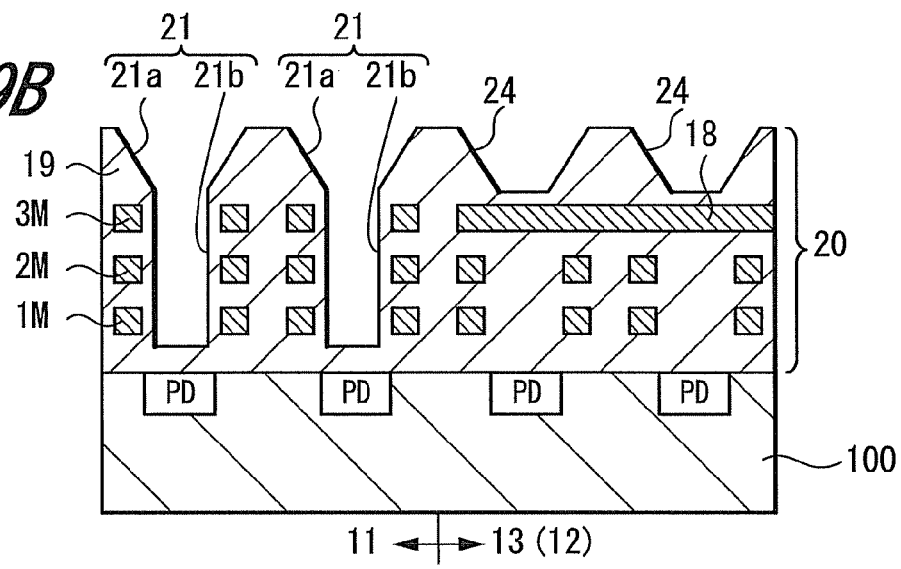
Figure 9C:
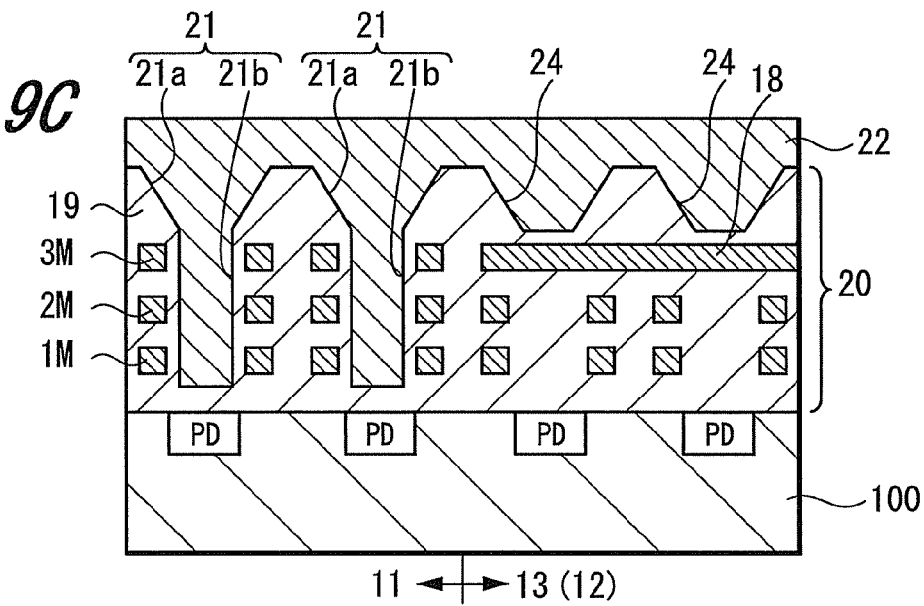

FIGS. 9A to 9C are schematic cross-sectional views illustrating a fourth example of a method of manufacturing a solid-state imaging device according to an embodiment of the present invention. The cross-sectional structure of the solid-state imaging device schematically illustrated in FIGS. 9A to 9C is viewed along the line A-A or B-B in FIG. 4 as in the case with the first to third examples. In other words, it is along the line extending across an effective pixel region 11 and a peripheral area 13 including an optical black region 12 and a peripheral circuit part 14. In FIGS. 9A to 9C, the same structural elements as those in any of FIGS. 5 to 7 are designated by the same reference numerals and thus detailed description thereof will be hereinafter omitted.

In this example, as shown in FIG. 9A, a plurality of wiring layers 20 formed on a peripheral area 13 include three layers of metal wiring lines 1M, 2M, and 3M. Among them, the uppermost metal wiring line 3M is provided as a shading film 18.

First, as shown in FIG. 9A, each of first opening portions 21a and dummy openings 24 is formed where the side walls thereof are tapered to have a broad opening through which light enters. The first opening portions 21a are formed above photodiodes PD on the effective pixel region 11, while the dummy openings 24 are formed on the peripheral area 13. The tapered first opening portions 21a and dummy openings 24 can be formed using a combination of isotropic etching and anisotropic etching. In addition, the tapered first opening portions 21a and the tapered dummy openings 24 are formed such that they do not touch any metal wiring line in the plurality of wiring layers 20. The dummy opening 24 formed on the peripheral area 13 extends to a position immediately above the metal wiring line 3M provided as a shading film 18. Also, the first opening portion 21a formed on the effective pixel region 11 is similarly formed.

Subsequently, as shown in FIG. 9B, the tapered first opening portion 21a formed on the effective pixel region 11 is further etched toward the corresponding photodiode PD to make a second opening portion 21b with a vertical inner wall extending to a position immediately above the photodiode PD. Therefore, openings 21 each having the tapered first opening portion 21a and the second opening portion 21b are formed on the effective pixel region 11.

Furthermore, as shown in FIG. 9C, an embedding material is applied to the openings 21 formed in the plurality of wiring layers 20 on the effective pixel region 11 and the dummy openings 24 formed in the insulating interlayer 19 in the plurality of wiring layers 20 on the peripheral area 13, thereby forming a buried layer 22. In this case, it is preferable that the opening 21 is covered and filled with, for example, an organic material with a refractive index higher than that of the insulating interlayer 19 in the plurality of wiring 20, thereby forming an optical waveguide in each of the openings 21 above the corresponding photodiodes PD on the effective pixel region 11. Since the openings 21 are embedded with the organic material with a high reflective index, the optical waveguide in each opening 21 refracts the incident light on the effective pixel region 11 to allow the light to efficiently enter the photodiode PD of the effective pixel region 11.

In the fourth example, as described above, the metal wiring line 3M on the peripheral area 13 is provided as a shading film 18. Since the shading film 18 is formed, light is prevented from being incident on the photodiodes PD in the optical black region 12. Therefore, the optical black region 12 can output a signal representing the black level.

According to the fourth example, since the dummy openings 24 are formed in the peripheral area 13 where any openings may not be originally required, a difference in the density of distribution of openings in the plurality of wiring layers 20 can be reduced. Thus, an embedding material can be evenly applied to the plurality of wiring layers 20. Therefore, a difference in level on the boundary between the effective pixel region 11 and the peripheral area 13 can be reduced. In addition, the openings 21 formed in the plurality of wiring layers 20 on the effective pixel region 11 and the dummy openings 24 formed in the plurality of wiring layers 20 on the peripheral area 13 may be formed so that they can have substantially the same opening volume. In this case, even if the volume of the buried material is reduced at the time of baking, the reducing volume of the buried layer 22 of the effective pixel region 11 and the reducing volume of the buried layer 22 of the peripheral area 13 can be adjusted to be equal to each other. Therefore, even after the step of baking the buried layer 22, a difference in level on the surface of the buried layer 22 on the boundary between the effective pixel region 11 and the peripheral area 13 can be reduced.

Furthermore, in the fourth example, since the operation of making openings in the effective pixel region 11 is divided into two steps, the openings 21 of the effective pixel region 11 can be formed into a shape advantageous to the optical characteristics. In this example, the entrance of the optical waveguide that is an upper portion thereof is tapered so that the light-entering side of the opening can be formed widely. Thus, the amount of light incident on the photodiode PD through the optical waveguide can be increased. The first opening portion 21a is formed in a tapered shape on the effective pixel region 11. Thus, incident light reflects toward the photodiode PD even if it reflects on the side wall of the first opening portion 21a. Therefore, it is also advantageous in terms of light-collecting efficiency.

In the fourth example as described above, alternatively, the tapered first opening portions 21a and dummy openings 24 may be made into a lens shape in the first step of forming openings. When the first opening portion 21a is formed in a lens shape, light can be more easily collected into the photodiode PD because of a widened entrance of the opening and a lens function.

Figure 10:
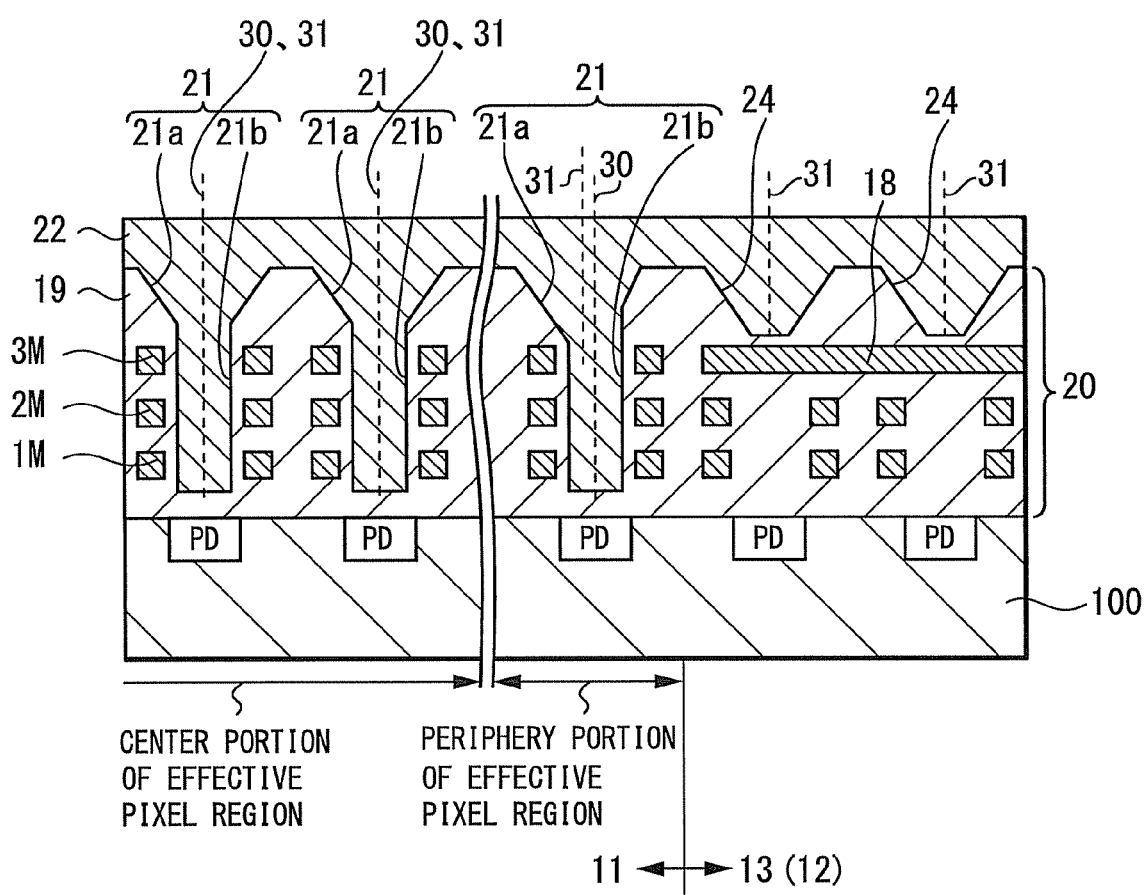
FIG. 10 is a schematic cross-sectional view illustrating a modified example of the fourth example of a method of manufacturing a solid-state imaging device according to an embodiment of the present invention.

Pupil correction may be performed in the first step out of two steps of forming openings, when the openings 21 are formed on the effective pixel region 11 through the two steps. Typically, pupil correction is performed on an on-chip microlens formed on the light incident surface above the buried layer 22. Specifically, the pupil correction is carried out such that the optical-axis center of the on-chip microlens is aligned with the optical axis of the photodiode in the center portion of the effective pixel region 11. Then, the center position of the on-chip microlens is shifted along the direction of principle rays on the periphery potion of the effective pixel region 11. In other words, the center position of the on-chip microlens is shifted from the center of the photodiode PD to the center of the effective pixel region 11 along the direction from the center portion of the effective pixel region 11 to the periphery portion thereof. In the fourth example, each opening 21 is formed by two steps of opening operation. Here, as illustrated in FIG. 10, for example, the center 31 of the first opening portion 21a, which is formed by the first step of operation, is shifted from the center of the photodiode PD so as to be on the optical axis of the on-chip microlens on a periphery portion of the effective pixel region 11. In the center portion of the effective pixel region 11, the first opening portion 21a is formed so that the center 31 thereof corresponds with the center of the photodiode PD. In the second step of operation of forming the second opening portion 21b, the center 30 thereof is made to correspond with the optical axis of the photodiode PD. In this way, since the openings 21 are formed through two steps of processing, rays of light gathered by the on-chip microlens may be fully collected by the first opening portion 21a opened by the first step. Therefore, the openings 21 may be formed to allow the incident light to efficiently enter the openings 21. In addition, light gathered by the microlens subjected to the pupil correction can be efficiently introduced into the photodiodes PD on the periphery portion of the effective pixel region 11.

Figure 11:
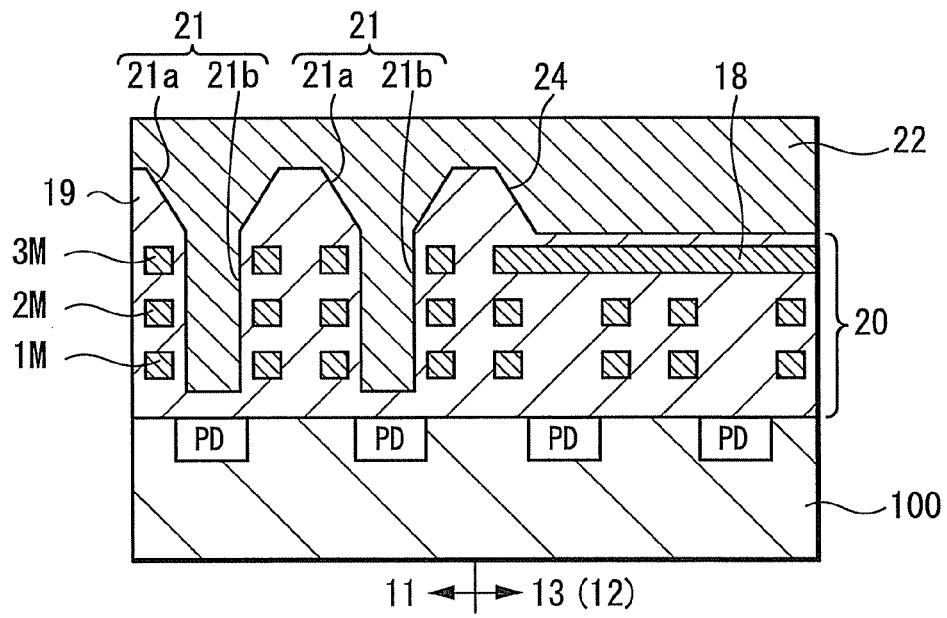
FIG. 11 is a schematic cross-sectional view illustrating a modified example of the fourth example of a method of manufacturing a solid-state imaging device according to an embodiment of the present invention.

In addition, if it is difficult to obtain the dummy openings 24 having a sufficient depth formed in the plurality of wiring layers 20 on the peripheral area 13, then the dummy openings 24 on the peripheral area 13 may be formed wider than the openings 21 on the effective pixel region 11 as shown in FIG. 11. In this way, with the optimized opening pattern of dummy openings 24 on the peripheral area 13 instead of optimizing the pattern of openings 21 on the effective pixel region 11, a difference in level on the boundary between the effective pixel region 11 and the peripheral area 13 can be reduced.

Figure 12:
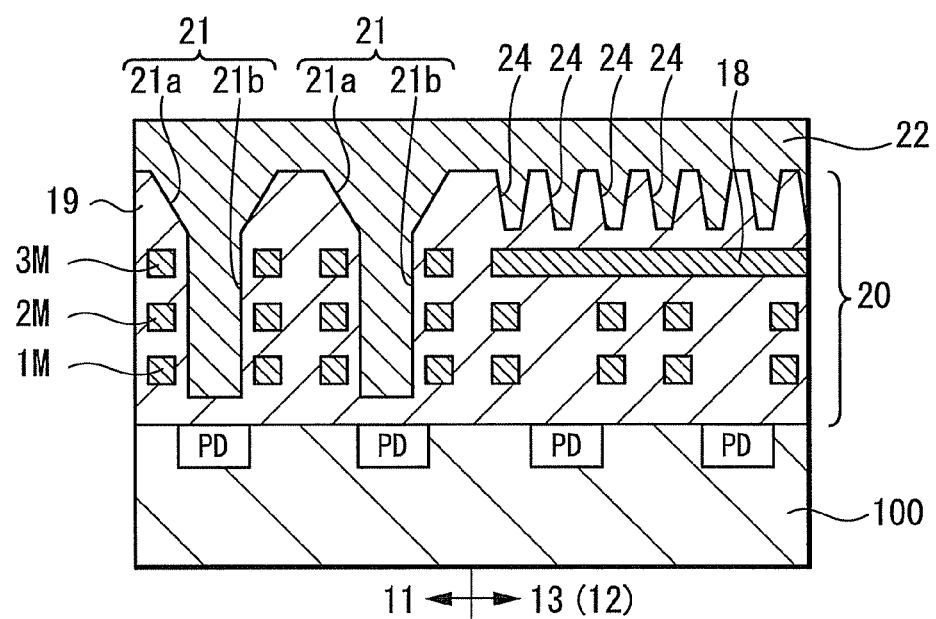
FIG. 12 is a schematic cross-sectional view illustrating a modified example of the fourth example of a method of manufacturing a solid-state imaging device according to an embodiment of the present invention.

Furthermore, as shown in FIG. 12, each of the dummy openings 24 on the peripheral area 13 may have a tapered side wall as its opening pattern. Such an opening pattern of the dummy openings 24 may be minutely formed to obtain an optical interference effect. In addition, the dummy openings 24 can also be formed densely compared with the openings 21 on the effective pixel region 11. In this way, the opening pattern of the dummy opening 24 with a tapered side wall on the peripheral area 13 is formed to have an optical interference effect. Thus, the reflection of oblique light rays can be suppressed. In addition, the reflection of light rays on the shading film, which may cause flares, can be suppressed.

As described above, two steps of opening operation are carried out independently to form the openings 21 on the effective pixel region 11 and dummy openings 24 on the peripheral area 13. Thus, the shape of the openings 21 and the dummy openings 24 can be suitably modified if required. According to an embodiment of the present invention, in other words, an increase in flexibility of the shape of openings on the effective pixel region 11 leads to improved light-collecting, color-mixing, and shading properties.

As described in any of the first to fourth examples, the complete solid-state imaging device shown in FIG. 4 can be obtained by covering and filling the openings 21 and the dummy openings 24 with the buried layer 22 to be planarized and then stacking a passivation film, a color filter, and an on-chip microlens.

Furthermore, the solid-state imaging device 1 manufactured by the method of manufacturing the same as described in any of the first to fourth examples can reduce an unevenness of the buried layer 22 on the boundary between the effective pixel region 11 and the peripheral area 13. Thus, the respective layers formed and stacked on the buried layer 22 can be prevented from the effect of such unevenness. Therefore, the effective pixel region 11 can be prevented from being affected by such difference in level, so that sensitivity of the solid-state imaging device can be maintained with reduced unevenness thereof.

The solid-state imaging device and the method of manufacturing the same according to any of the first to fourth examples described above are those in which the optical waveguide is formed immediately above the corresponding photodiode PD on the effective pixel region 11. According to an embodiment of the present invention, openings other than the openings 21 as the waveguide can be formed.

For example, in the case where metal wiring lines in a wiring layer are made of Cu, a Cu diffusion-preventing film may be formed for each Cu wiring layer. In this case, if the Cu diffusion-preventing film is formed above the photodiode that is the light-entering side on the effective pixel region, a change in refractive index or the like may cause a decrease in amount of light incident on the photodiode.

Therefore, typically, an opening is formed in the wiring layer immediately above the photodiode on the effective pixel region to remove the Cu diffusion-preventing film above the photodiode on the effective pixel region. In this case, as represented in any of the first to fourth examples, dummy openings may be formed on the peripheral area, thereby reducing a difference in level on the boundary between the effective pixel region and the peripheral area in the subsequent step of forming the buried layer. In this case, furthermore, the buried layer on the openings is made of an insulating film formed of an organic material with a high reflective index as represented in any of the first to forth examples.

In the above case, similar to the solid-state imaging device manufactured by the method as represented in any of the first to forth examples, a difference in level on the boundary between the effective pixel region and the peripheral area can be reduced. Thus, a passivation film, a color filter, and an on-chip microlens can be evenly stacked on that boundary. Therefore, the effective pixel region is prevented from being affected by the difference in level, so that the solid-state imaging device can be prevented from having uneven sensitivity.

A CMOS image sensor has been used and described in the above examples of a solid-state imaging device according to an embodiment of the present invention. Alternatively, according to an embodiment of the present invention, a CCD image sensor having an optical waveguide directly above a photodiode as a photoelectric conversion element can be used.

According to an embodiment of the present invention, a peripheral area 13 adjacent to an effective pixel region 11 may include only an optical black region 12 adjacent to the effective pixel region 11, or only a peripheral circuit part 14 adjacent to an effective pixel region 11 without an optical black region 12, or both the optical black region 12 and the peripheral circuit part 14. Thus, the dummy opening 24 may be formed only on the optical black region 12, only on the peripheral circuit part 14, or on part of the optical black region 12 and the peripheral circuit part 14. Further, various other configurations can be used.

Figure 13:
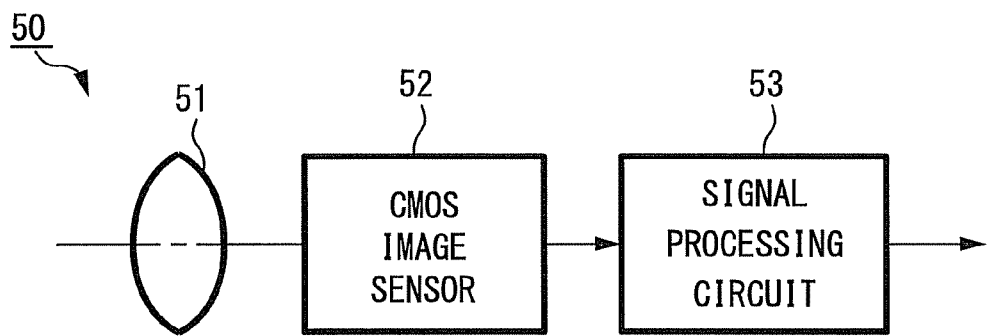
FIG. 13 is a schematic diagram illustrating an electronic apparatus using a CMOS image sensor according to an embodiment of the present invention.
Figure 14:
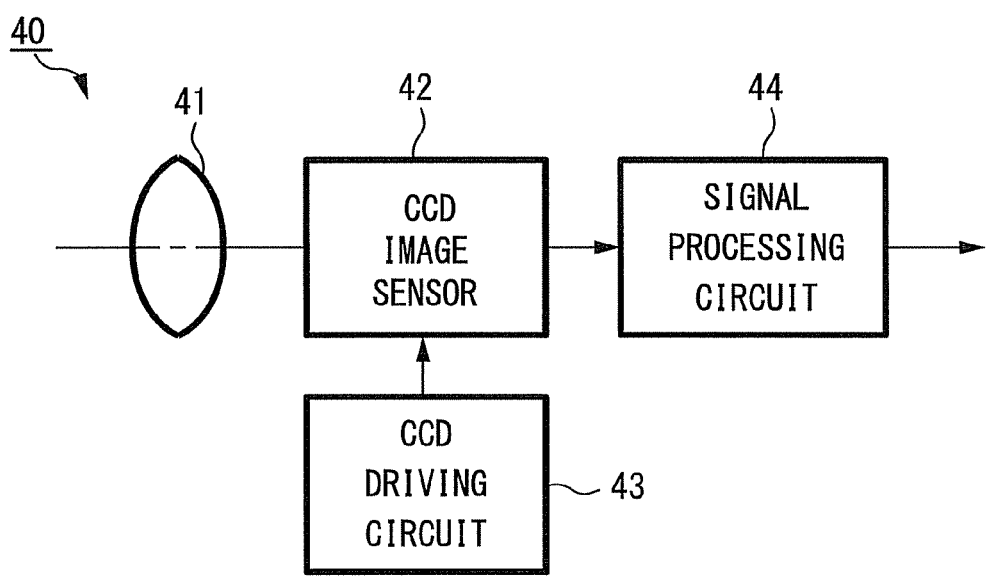
FIG. 14 is a schematic diagram illustrating an electronic apparatus using a CCD image sensor according to an embodiment of the present invention.

FIGS. 13 and 14 are schematic diagrams illustrating a configuration of a camera according to another embodiment of the present invention.

The camera according to the embodiment uses the solid-state imaging device manufactured by any of the above first to fourth examples. FIG. 13 illustrates a CMOS image sensor as an example of the solid-state imaging device. FIG. 14 illustrates a CCD image sensor as an example of the solid-state imaging device.

As shown in FIG. 13, a camera 50 includes an optical system 51, a CMOS image sensor 52 according to an embodiment of the present invention, and a signal processing circuit 53. Alternatively, the camera of the present embodiment may be a module including an optical system 51, a CMOS module sensor 52, and a signal processing circuit 53. The optical system 51 forms an image of image light (incident light) from a subject on the imaging area of the CMOS image sensor 52. Subsequently, a photodiode that is the photoelectric conversion element of the CMOS image sensor 52 converts the incident light into signal electric charges in response to the amount of the incident light. Subsequently, the CMOS sensor 52 outputs the signal electric charges. Here, the CMOS image sensor 52 includes a vertical driving circuit, a horizontal driving circuit, a column signal processing circuit, and a control circuit for controlling these circuits. Signals output from the CMOS sensor 52 are subjected to various kinds of signal processing in the signal processing circuit 53 and then output as video signals from the circuit 53.

As shown in FIG. 14, a camera 40 includes an optical system 41, a CCD image sensor 42 according to an embodiment of the present invention, a CCD driving circuit 43, and a signal processing circuit 44. Alternatively the camera of the present embodiment may be a module including an optical system 41, a CCD image sensor 42, a CCD driving circuit 43, and a signal processing circuit 44. The optical system 41 forms an image of image light (incident light) from a subject on the imaging area of the CMOS image sensor 42. Subsequently, a photodiode that is the photoelectric conversion element of the CCD image sensor 42 converts the incident light into signal electric charges in response to the amount of the incident light. Subsequently, the CCD driving circuit 43 carries out such driving that signal electric charges are read out from the CCD image sensor 42 to a vertical charge transfer section and then transferred from the vertical charge transfer section to the horizontal charge transfer section. Signals from the CCD image sensor 42 are subjected to various kinds of signal processing in the signal processing circuit 44 and then output as video signals from the circuit 44.

Each of the cameras illustrated in FIGS. 13 and 14 uses a solid-state imaging device with a reduced difference in level on the boundary between an effective pixel region and a peripheral area. Thus, the camera may have a reduced uneven sensitivity.

According to further embodiment of the present invention, any of the above cameras 40 and 50 may be incorporated in an electronic apparatus to provide one with a built-in camera, such as a mobile phone unit with a camera, thereby providing the electronic apparatus with high reliability because of the reduced uneven sensitivity of the built-in camera.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device that includes (a) an effective pixel region, where a plurality of pixels, each having a photoelectric conversion element, is arranged, and (b) a peripheral area adjacent to the effective pixel region, the device comprising:
an opening in an insulating layer above the photoelectric conversion element on the effective pixel region;
a shading film in an insulating layer of the peripheral area;
a dummy opening above the shading film in the peripheral area; and
a buried layer filling both the opening and the dummy opening and that is made of an insulating material.

2. The solid-state imaging device according to claim 1, wherein the dummy opening is in an optical black region having a plurality of pixels and/or a peripheral circuit part on the peripheral area.

3. The solid-state imaging device according to claim 1, wherein the buried layer is made of an organic material having a refractive index higher than a refractive index of the insulating layer.

4. The solid-state imaging device according to claim 1, wherein the opening in the insulating layer on the effective pixel region has substantially the same opening volume as that of the dummy opening in the insulating layer on the peripheral area.

5. The solid-state imaging device according to claim 1, wherein an upper portion of a side wall of the opening is in a tapered shape.

6. The solid-state imaging device according to claim 1, wherein the dummy opening in the insulating layer on the peripheral area has an optical interference effect.

7. The solid-state imaging device according to claim 1, wherein the opening comprising a plurality of openings and the dummy opening comprising a plurality of dummy openings, wherein the plurality of dummy openings are at intervals substantially the same as those of the plurality of openings.

8. The solid-state imaging device according to claim 1, wherein the shading film is a topmost metal wiring line in the insulating layer of the peripheral area.

9. The solid-state imaging device according to claim 1, wherein the shading film is a middle metal wiring line in the insulating layer of the peripheral area.

10. A camera including
a solid-state imaging device;
an optical system configured to introduce incident light into a photoelectric conversion element of the solid-state imaging device; and
a signal processing circuit configured to process a signal output from the solid-state imaging device, the solid-state imaging device comprising:
an effective pixel region, where a plurality of pixels each having the photoelectric conversion element is arranged;
a peripheral area adjacent to the effective pixel region;
an opening in an insulating layer above the photoelectric conversion element on the effective pixel region;
a shading film in an insulating layer of the peripheral area;
a dummy opening above the shading film in the peripheral area; and
a buried layer filling both the opening and the dummy opening and that is made of an insulating material.

11. An electronic apparatus including a camera having a solid-state imaging device, an optical system configured to introduce incident light into a photoelectric conversion element of the solid-state imaging device, and a signal processing circuit configured to process a signal output from the solid-state imaging device, the solid-state imaging device comprising:
an effective pixel region, where a plurality of pixels each having the photoelectric conversion element is arranged;
a peripheral area adjacent to the effective pixel region;
an opening in an insulating layer above the photoelectric conversion element on the effective pixel region;
a shading film in an insulating layer of the peripheral area;
a dummy opening above the shading film in the peripheral area; and
a buried layer filling both the opening and the dummy opening and that is made of an insulating material.

* * * * *